(12) United States Patent
Oh et al.

(10) Patent No.: US 10,546,765 B2
(45) Date of Patent: Jan. 28, 2020

(54) WAFER PERFORATING DEVICE

(71) Applicant: Samsung Electronics Co., Ltd., Suwon-si, Gyeonggi-do (KR)

(72) Inventors: Kyoung Whan Oh, Hwaseong-si (KR); Yeon Woo Choi, Suwon-si (KR); Won Yup Ko, Seongnam-si (KR); Min Seok Moon, Seoul (KR); Won Ki Park, Seoul (KR); Seung Hwan Lee, Suwon-si (KR); Yong Won Choi, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 321 days.

(21) Appl. No.: 15/474,276

(22) Filed: Mar. 30, 2017

(65) Prior Publication Data

US 2018/0076060 A1 Mar. 15, 2018

(30) Foreign Application Priority Data

Sep. 12, 2016 (KR) ........................ 10-2016-0117206

(51) Int. Cl.
*H01L 21/67* (2006.01)
*H01L 21/68* (2006.01)
(Continued)

(52) U.S. Cl.
CPC ........ *H01L 21/67115* (2013.01); *B23K 26/38* (2013.01); *B23K 26/53* (2015.10);
(Continued)

(58) Field of Classification Search
CPC ......... H01L 21/67; H01L 21/68; B23K 26/00; B23K 26/38
(Continued)

(56) References Cited

U.S. PATENT DOCUMENTS 6,166,432 A * 12/2000 Ohno .................. H01L 21/6833
257/701
6,835,415 B2 * 12/2004 Blaedel .................. H01L 21/02
257/E21.002
(Continued)

FOREIGN PATENT DOCUMENTS

JP 3174707 B2 3/2001
JP 2009-140959 A 6/2009
(Continued)

*Primary Examiner* — Samuel M Heinrich
(74) *Attorney, Agent, or Firm* — Myers Bigel, P.A.

(57) ABSTRACT

A wafer perforating device includes a chuck stage configured to receive a wafer, a housing spaced apart in a vertical direction on the chuck stage, wherein at least one of the housing and the chuck stage moves in a first horizontal direction, and the housing and the chuck stage intersect each other on the first direction, a displacement sensor fixed within the housing and configured to measure a displacement with a surface of the wafer at a perforating point spaced apart periodically in the first direction of the wafer and a laser module fixed within the housing and configured to irradiate a laser into a perforating depth determined according to the displacement at the perforating point. The displacement sensor determines whether an upper particle and a lower particle are present at the perforating point by considering a step height of the displacement, and ignores the displacement of the perforating point with the presence of an upper particle.

20 Claims, 13 Drawing Sheets

(51) Int. Cl.
*B23K 26/00* (2014.01)
*B23K 26/38* (2014.01)
*B23K 26/53* (2014.01)
*H01L 21/687* (2006.01)
*B23K 101/40* (2006.01)
*B23K 103/00* (2006.01)

(52) U.S. Cl.
CPC .. *H01L 21/67248* (2013.01); *H01L 21/67259* (2013.01); *H01L 21/67288* (2013.01); *H01L 21/68757* (2013.01); *B23K 2101/40* (2018.08); *B23K 2103/56* (2018.08)

(58) Field of Classification Search
USPC .......................................... 219/121.6–121.86
See application file for complete search history.

(56) References Cited

U.S. PATENT DOCUMENTS

| | | | | |
|---|---|---|---|---|
| 7,489,454 | B2 * | 2/2009 | Fukuyo | B28D 1/221 |
| | | | | 359/740 |
| 7,605,344 | B2 * | 10/2009 | Fukumitsu | B23K 26/03 |
| | | | | 219/121.72 |
| 8,462,331 | B2 | 6/2013 | Ryu et al. | |
| 8,624,153 | B2 * | 1/2014 | Atsumi | B23K 26/046 |
| | | | | 219/121.67 |
| 8,753,897 | B2 | 6/2014 | Ferrari et al. | |
| 9,352,414 | B2 | 5/2016 | Atsumi et al. | |
| 2002/0002415 | A1 * | 1/2002 | Mugibayashi | H01L 22/20 |
| | | | | 700/110 |
| 2005/0258335 | A1 * | 11/2005 | Oshiro | G02B 21/244 |
| | | | | 250/201.3 |
| 2005/0260829 | A1 * | 11/2005 | Uematsu | H01L 21/304 |
| | | | | 438/460 |
| 2007/0054498 | A1 * | 3/2007 | Iizuka | H01L 21/6715 |
| | | | | 438/758 |
| 2009/0284894 | A1 * | 11/2009 | Cooke | H01L 21/6875 |
| | | | | 361/234 |
| 2012/0052605 | A1 | 3/2012 | Jang | |
| 2014/0342466 | A1 | 11/2014 | Ferrari et al. | |

FOREIGN PATENT DOCUMENTS

| | | |
|---|---|---|
| KR | 10-0766171 B1 | 10/2007 |
| KR | 10-2009-0007275 A | 1/2009 |
| KR | 10-1165993 B1 | 7/2012 |
| KR | 10-1181204 B1 | 9/2012 |
| KR | 10-1211104 B1 | 12/2012 |
| WO | WO 2007/120248 A2 | 10/2007 |

* cited by examiner

WAFER PERFORATING DEVICE

CROSS-REFERENCE TO RELATED APPLICATION

This application claims priority from Korean Patent Application No. 10-2016-0117206 filed on Sep. 12, 2016 in the Korean Intellectual Property Office, and all the benefits accruing therefrom under 35 U.S.C. 119, the contents of which in its entirety are herein incorporated by reference.

FIELD

The present disclosure relates to a wafer perforating device.

BACKGROUND

Cutting process is needed in order to dichotomize a wafer into chips. In a related art, blade sawing with the utilization of a diamond blade is typically performed. Wafer particles may occur during the cutting process when the blade is used. Further, supply of a cutting water to lower the temperature may be needed, and accordingly, a cleaning process may be needed. Also, there may be a high risk of damages to the patterns formed on the wafer during a physical cutting process.

Therefore, in order to remedy such shortcomings, cutting with the utilization of a laser recently has been used. Cutting with a may first involve a perforating process. The position of perforating focus with the utilization of the laser may be placed within the wafer. That is, the wafer may be divided into a plurality of dies by the process of passing through a surface of the wafer to perforate a hole within the wafer, and then by the chill and expander process.

At the above process, because the perforating position is placed within the wafer, such cutting process is named as "stealth cut" in view of it being unseen from the outside. The cutting process is similar to forming a crack.

SUMMARY

It is one technical object of the present disclosure to provide a wafer perforating device with improved operating characteristics.

The objects according to the present disclosure are not limited to those set forth above and objects other than those set forth above will be clearly understood to a person skilled in the art from the following description.

According to an aspect of the present inventive concept, there is provided a wafer perforating device, comprising a chuck stage mounted with a wafer, a housing spaced apart in a vertical direction on the chuck stage and the wafer, wherein at least one of the housing and the chuck stage moves in a first direction of a horizontal direction, and the housing and the chuck stage intersect each other on the first direction, a displacement measure module fixed within the housing and configured to measure a displacement with a surface of the wafer at a perforating point spaced apart periodically in the first direction of the wafer and a laser module fixed within the housing and configured to irradiate a laser into a perforating depth determined according to the displacement at the perforating point, wherein the displacement measure module determines whether an upper particle and a lower particle are present at the perforating point by considering a step height of the displacement, ignores the displacement of the perforating point with presence of the upper particle, and considers the displacement of the perforating point with presence of the lower particle.

According to another aspect of the present inventive concept, there is provided a wafer perforating device, comprising a chuck stage to be mounted with a wafer, a fixing arm spaced apart in a vertical direction on the chuck stage and the wafer, wherein at least one of the fixing arm and the chuck stage moves in a horizontal direction and the fixing arm and the chuck stage intersect each other on the horizontal direction, a housing comprising a bracket connected with the fixing arm on one side, a displacement measure module fixed within the housing and configured to measure a displacement from a surface of the wafer at a perforating point spaced apart periodically in the first direction of the horizontal direction of the wafer and a laser module fixed within the housing and configured to irradiate a laser into a perforating depth determined according to the displacement at the perforating point, wherein the displacement measure module corrects the displacement according to temperature, detects an upper particle and a lower particle, and corrects the displacement based on the detected upper particle and lower particle.

According to still another aspect of the present inventive concept, there is provided a wafer perforating device, comprising a chuck stage to be mounted with a wafer and a perforator comprising a displacement measure module moving relatively with the chuck stage in three axis directions which are vertical to each other on the chuck stage and configured to measure a displacement from a surface of the wafer, and a laser module configured to perforate the wafer with a laser based on the displacement, wherein a moving section of the perforator comprises a constant velocity section of moving with constant velocity and a reduced velocity section of reducing velocity to zero, the laser module perforates the wafer at the constant velocity section, and does not perforate the wafer at the reduced velocity section, and the displacement measure module detects an upper particle and a lower particle, and corrects the displacement based on the detected upper particle and lower particle.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings.

DETAILED DESCRIPTION

Hereinbelow, a wafer perforating device according to some exemplary embodiments will be described with reference to FIGS. 1 to 6.

Figure 1:
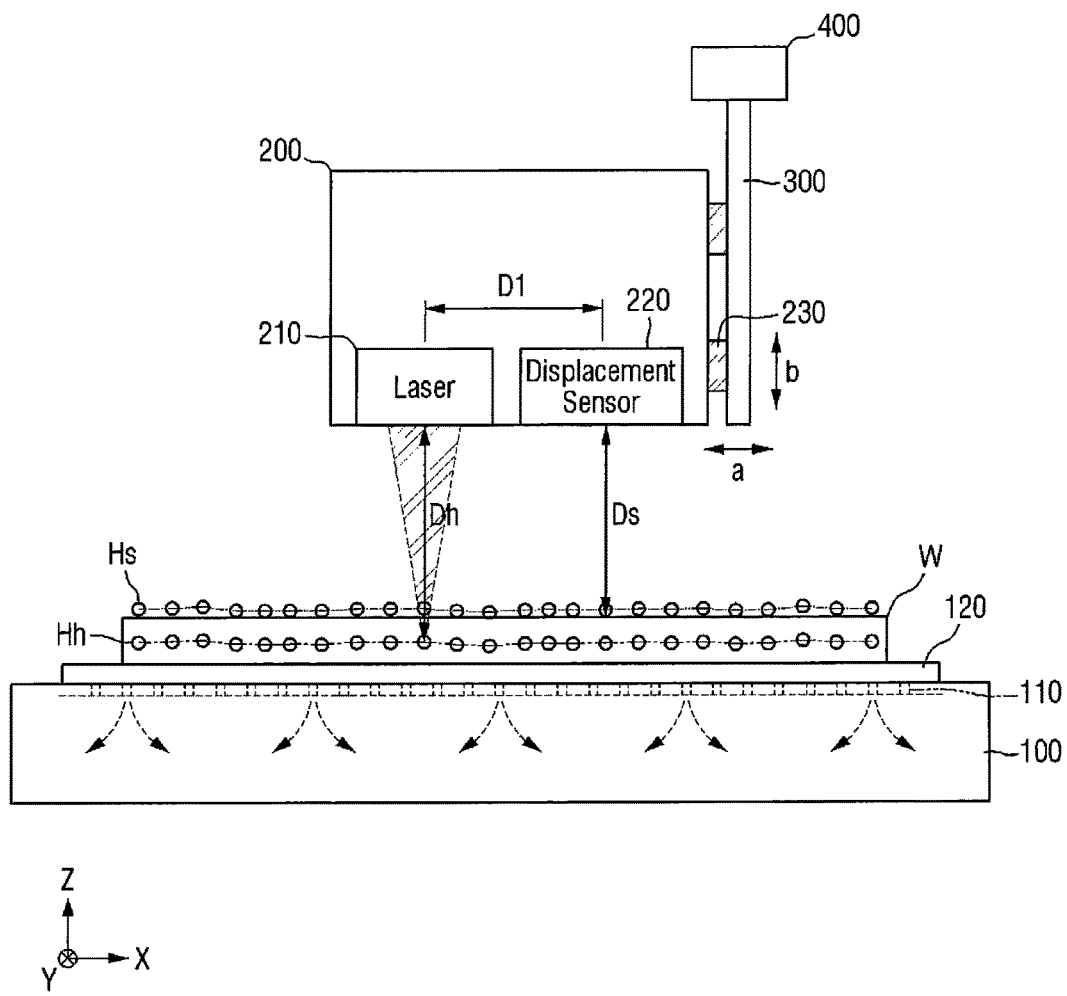
FIG. 1 is a concept view provided to explain a wafer perforating device according to some exemplary embodiments.
Figure 2:
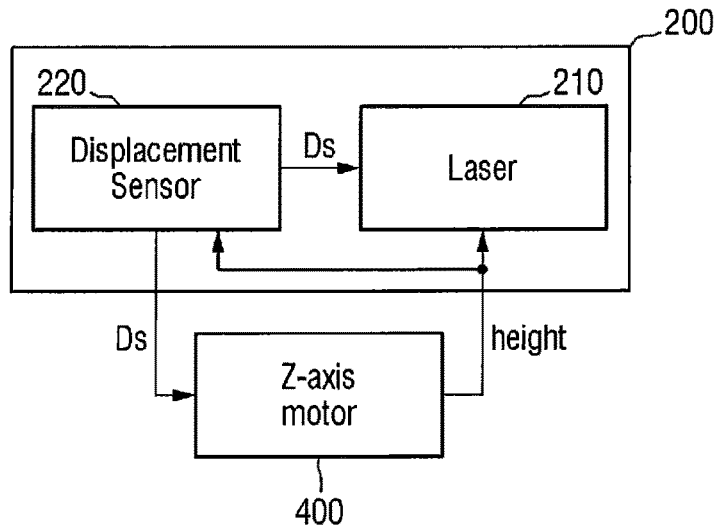
FIG. 2 is a block view provided to explain the device of FIG. 1.
Figure 3:
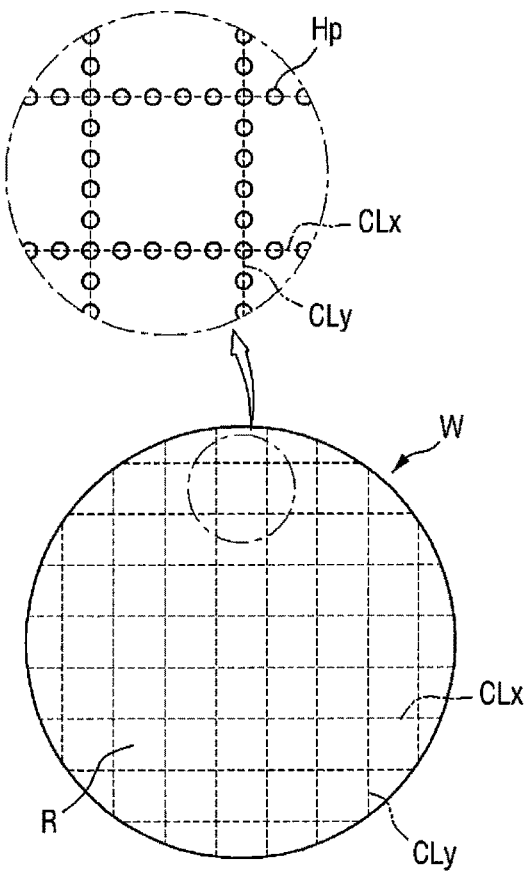
FIG. 3 is an exemplary top view provided to explain a perforating point on a wafer.
Figure 4:
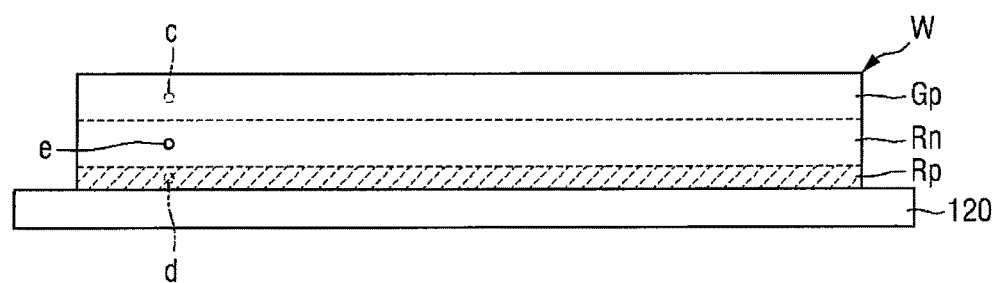
FIG. 4 is a sectional view provided to explain perforating position of a wafer.
Figure 5:
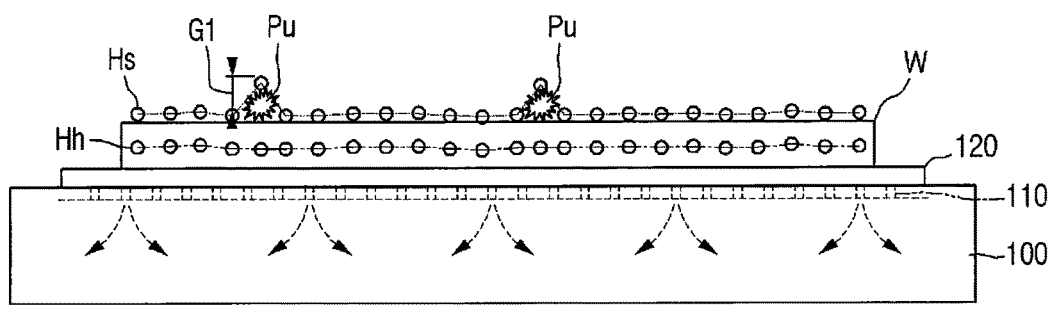
FIG. 5 is a concept view provided to explain operation of a wafer perforating device when a particle is on an upper portion of a wafer.
Figure 5:
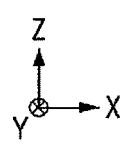
Figure 6:
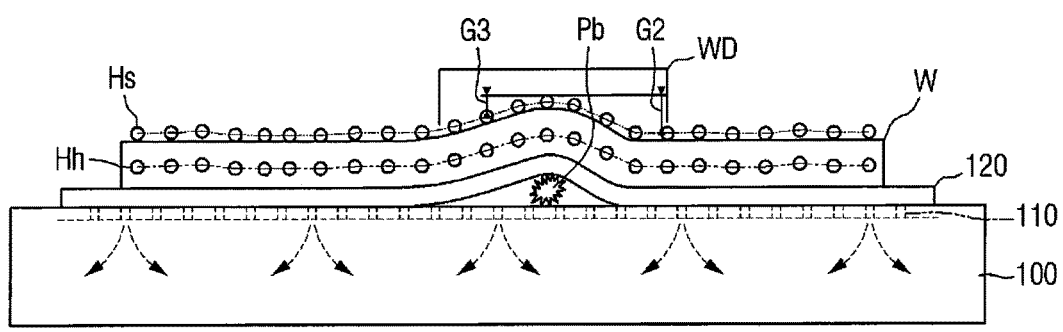
FIG. 6 is a concept view provided to explain operation of a wafer perforating device when a particle is on a lower portion of a wafer.
Figure 6:
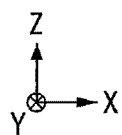

FIG. 1 is a concept view provided to explain a wafer perforating device according to some exemplary embodiments, and FIG. 2 is a block view provided to explain the device of FIG. 1. FIG. 3 is an exemplary top view provided to explain a perforating point on a wafer, and FIG. 4 is a cross-sectional view provided to explain perforating position of the wafer. FIG. 5 is a concept view provided to explain operation of a wafer perforating device when a particle is on an upper portion of a wafer. FIG. 6 is a concept view provided to explain operation of a wafer perforating device when a particle is on a lower portion of a wafer.

Referring to FIGS. 1 to 6, the wafer perforating device according to some exemplary embodiments may include a chuck stage 100, an adhesive film 120, a housing 200, a fixing arm 300, a bracket 230, a Z axis motor 400, a displacement measure module 220 and a laser module 210.

The chuck stage 100 may be mounted with the wafer W. The wafer W may be mounted on an upper surface of the chuck stage 100. The wafer W may have a broad circular plate shape. Accordingly, the chuck stage 100 may include a sufficiently broad and flat upper surface such that the wafer W can be mounted evenly. The upper surface of the chuck stage 100 may be plane having a normal line in a third direction Z. However, exemplary embodiments are not limited to the example given above.

The chuck stage 100 may include a suction hole 110. The suction hole 110 may be formed on an upper surface of the chuck stage 100. A plurality of suction holes 110 may be provided. The suction holes 110 may be formed by being aligned at a certain interval. However, exemplary embodiments are not limited to the example given above. The suction holes 110 may adsorb the wafer W or the adhesive film 120 on the chuck stage 100.

Specifically, the suction hole 110 may suction and fix an object mounted on the upper surface of the chuck stage 100 with vacuum. The suction holes 110 may fix an object through the suction, which can enhance the reliability of various processes performed with respect to an object on the chuck stage 100.

The wafer W indicates a thin plate of a semiconductor such as silicon which is a starting raw material for manufacturing an integrated circuit (IC). The wafer W may indicate a silicon substrate before being diced. That is, the wafer W may be a thin plate before a process to form a plurality of chips is separated therefrom. The wafer W may be mounted on the chuck stage 100 and separated. Through such process, the wafer W may be divided into a plurality of individual chips.

The adhesive film 120 may be placed on the chuck stage 100. The adhesive film 120 may be positioned between the wafer W and the chuck stage 100. The adhesive film 120 may include an adhesive component. The adhesive film 120 may be disposed on the chuck stage 100 to fix the wafer W. The adhesive film 120 may have a sufficiently broad upper surface such that the entire lower surface of the wafer W can be adhered. The adhesive film 120 may be a thin film, and an upper surface of the adhesive film 120 may be formed on a plane having a third direction Z as a normal line.

That is, the wafer W may be completely fixed on the chuck stage 100 through the adhesive film 120 and the suction holes 110. Specifically, the suction holes 110 may adsorb and fix the adhesive film 120, and the adhesive film 120 may be adhered to the wafer by having the adhesive component on the upper surface or both the upper surface and the lower surface. Through the above process, the wafer W may be fixed with the chuck stage 100.

The lower surface of the wafer W may be formed with a pattern such as a transistor, and so on. That is, the wafer W formed with a pattern may be flipped and disposed on the chuck stage 100 such that the pattern is directed toward the lower surface. The above may prevent the pattern from being damaged in the perforating process. Because the pattern formed on the lower surface of the wafer W may not be directly in contact with the chuck stage 100, but fixed through the adhesive film 120, the pattern may not be damaged. That is, the adhesive film 120 may not only fix the wafer W and the chuck stage 100, but also prevent a pattern on the lower surface of the wafer W from being damaged.

Within the housing 200, the displacement measure module 220 and the laser module 210 may be fixed. The housing 200 may be connected with the fixing arm 300 through a bracket 230. The bracket 230 may be formed on one side surface of the housing 200. The housing 200 may have a barrel shape that is open in one direction, i.e., in the third direction Z and closed in the first direction X and the second direction Y.

The fixing arm 300 may be a pillar-shaped structure to which the housing 200 is fixed. The fixing arm 300 may be a robot arm that can move in three axes. The three axes may be X axis, Y axis, and Z axis which are vertical to each other, for example. The three axes may be, for example, three axes according to the first direction X, the second direction Y, and the third direction Z.

The wafer perforating device according to some exemplary embodiments may include the fixing arm 300 which moves in at least one axis instead of the three axes described above. In the above case, the chuck stage 100 may move in the other two axes. Accordingly, the fixing arm 300 and the chuck stage 100 may move relatively in the three axes.

For example, the fixing arm 300 may move in the third direction Z, i.e., along the Z axis, and the chuck stage 100 may move in the first direction X and the second direction Y, i.e., along the X and Y axes. The X and Y axes may be in horizontal directions, and Z axis may be in a vertical direction. However, exemplary embodiments are not limited to the example given above.

The fixing arm 300 may fix the housing 200. The fixing arm 300 may be fixed with the housing 200 through the bracket 230. That is, the bracket 230 may be prepared on the fixing arm 300, and the housing 200 may be coupled with the bracket 230. However, exemplary embodiments are not limited to the example given above. That is, in the wafer perforating device according to some exemplary embodiments, the fixing arm 300 and the housing 200 may be coupled with each other through another coupling structure instead of the bracket.

The Z axis motor 400 may move the fixing arm 300 in the third direction Z. The Z axis motor 400 may be connected with the end of the fixing arm 300. The Z axis motor 400 may move the fixing arm 300 in a vertical direction b. According to some exemplary embodiments, the Z axis motor 400 may move the fixing arm 300 in a horizontal direction a. According to another embodiment, the Z axis motor 400 may move the fixing arm 300 only in the vertical direction b, and the chuck stage 100 may move the fixing arm 300 in the horizontal direction a. As a result, the housing 200 and the wafer W may both move relatively, in the horizontal direction a and the vertical direction b. Through such movement, the housing 200 may be spaced apart in the third direction Z on the wafer W, and the housing 200 and the wafer W may overlap and intersect each other in the first direction X and the second direction Y.

In this case, the horizontal direction a may be a direction including the first direction X and the second direction Y.

The displacement measure module 220 may be fixed within the housing, and may measure a displacement Ds with a surface of the wafer W. That is, the displacement measure module 220 may be a sensor to measure the displacement Ds. The displacement measure module 220 may include a light emitter and a light receiver. That is, a displacement may be measured by emitting a light with the light emitter and receiving a reflecting light with the light receiver. In the above process, the light may be a laser. However, exemplary embodiments are not limited to the example given above. The displacement measure module 220 may transmit the measured displacement Ds to the laser module 210 and the Z axis motor 400.

The laser module 210 may perforate the wafer W via the laser. "Perforating" indicates making a hole within the wafer W; thereafter, cutting the wafer W may be facilitated through the perforated hole. The laser module 210 may determine a perforating depth Dh based on the displacement Ds. The perforating depth Dh may be greater than the displacement Ds. That is, because the displacement Ds may be a distance to the surface of the wafer W, considering that the perforating depth Dh may be vertically positioned within the wafer W, it is of course possible the perforating depth Dh may have a greater value than the displacement Ds.

The laser module 210 may include a laser head to emit a laser, and a focusing lens to collect the laser on one point.

The focusing lens may collect the scattered laser on one point such that the point is perforated. That is, the laser may pass through the upper surface of the wafer W, form a focus within the wafer, and form a hole within the wafer W.

The displacement measure module 220 and the laser module 210 may respectively measure the displacement Ds at a perforating point Hp, and perforate to the perforating depth Dh. Referring to FIG. 3, the wafer W may be separated into a plurality of dies R by cutting. Herein, the wafer W may be separated along a virtual first cut line CLx of the first direction X and a virtual second cut line CLy of the second direction Y. The first cut line CLx and the second cut line CLy may be orthogonal to each other in a horizontal direction. However, exemplary embodiments are not limited to the example given above.

Along the virtual first cut line CLx and the virtual second cut line CLy on the wafer W, the perforating point Hp may be formed. The perforating point Hp may be periodically formed along the first cut line CLx and the second cut line CLy. That is, intervals between the perforating point Hp may be regular.

That is, the displacement measure module 220 may measure the displacement Ds of the perforating point Hp, and the laser module 210 may perforate the wafer W according to the perforating depth Dh on the perforating point Hp. Therefore, a plurality of wafers W may be cut in the virtual first cut line CLx and second cut line CLy.

The displacement measure module 220 may be spaced apart from the laser module 210 by a first distance D1 in the first direction X. The first direction X may be a relative moving direction of the housing 200 and the wafer W. That is, as the housing 200 moves in the first direction X by the Z axis motor 400 or as the chuck stage 100 moves in the first direction X, the housing 200 may relatively move in the first direction X compared to the wafer W. As the displacement measure module 220 and the laser module 210 are spaced apart by the first distance D1, the displacement measure module 220 may measure the displacement Ds of the perforating point Hp in advance of the perforation of the laser module 210. Further, as the displacements Ds of a plurality of perforating points Hp are measured in advance, the perforating depth Dh of the laser module 210 may be precisely corrected. This will be explained below.

Referring to FIG. 1, on the surface of the wafer W, a scan height Hs measured at each perforating point Hp may be defined with the displacement measure module 220. The scan height Hs may be a height of the surface of the wafer W calculated with the displacement Ds. That is, difference between a height of a lower portion of the housing and the displacement Ds may be the scan height Hs. The scan height Hs may be measured only at the perforating point Hp.

Within the wafer W, a perforating height Hh may be defined by the laser module. Specifically, the perforating height Hh may be defined with the perforating depth Dh. That is, difference between the height of the lower portion of the housing and the perforating depth Dh may be the perforating height Hh. Because perforating is performed only at the perforating point Hp, the perforating height Hh may be effective only at the perforating point Hp.

Difference between the scan height Hs and the perforating height Hh may be regular. This may be caused by regular difference between the displacement Ds and the perforating depth Dh. That is, how deep the perforating depth should be from the wafer surface, may be previously set. The perforating depth Dh may be derived from the displacement Ds by using the previously set value, and the perforating height Hh may be derived from the scan height Hs.

Referring to FIG. 4, the wafer W may be formed on the lower portion where the pattern is in contact with the adhesive film 120. Accordingly, according to a height, a pattern region Rp adjacent to the pattern, a non-pattern region Rn spaced apart from the pattern, and a removal region Gp to be removed later may be included.

When the perforating height Hh of FIG. 1 is positioned within the removal region Gp, in other words, when perforating is performed at a first perforating point c of FIG. 4, the removal region Gp may disappear as the wafer becomes thinner with the subsequent grinding, and thus, the non-separation phenomenon of the wafer W may occur.

Meanwhile, when the perforating height Hh of FIG. 1 is positioned in the pattern region Rp, in other words, when perforating is performed at a second perforating point d of FIG. 4, the pattern formed on the wafer W may have a high risk of being damaged.

Accordingly, the perforating height Hh of FIG. 1 may be preferably positioned on a height same as the non-pattern region Rn, i.e., as a third perforating point e of FIG. 4. Accordingly, the laser module 210 may derive the perforating depth Dh and the perforating height Hh by using previously set proper values of the displacement Ds and the scan height Hs. Such perforating depth Dh and perforating height Hh may be values for the perforating point to be formed in the non-pattern region Rn.

Referring to FIG. 2, the displacement measure module 220 may transmit the displacement Ds to the laser module 210 and the Z axis motor 400. The Z axis motor 400 may entirely adjust heights of the fixing arm 300, the housing 200, the displacement measure module 220 and the laser module 210 through the transmitted displacement Ds. Further, the adjusted height may be transmitted to the displacement measure module 220 and the laser module 210.

With this height, the displacement measure module 220 may calculate a difference between a previous displacement Ds and a current displacement Ds more accurately. Further, the laser module 210 may calculate the perforating depth Dh through the height and the displacement Ds.

Referring to FIGS. 1 and 5, an upper particle Pu may be present on the wafer W. The upper particle Pu may include every particle that may interfere with the measurement of the displacement Ds in FIG. 1. The upper particle Pu may be that which is particulated from the adhesive component of the adhesive film 120. However, exemplary embodiments are not limited to the example given above.

When the upper particle Pu is present, the displacement Ds measured at the perforating point Hp, where the upper particle Pu is present, by the displacement measure module 220 may have an error due to a height of the upper particle Pu. That is, there may be a momentary step height G1 formed as much as a height of the upper particle Pu. Herein, the momentary step height G1 may indicate a height difference between the adjacent perforating points Hp. That is, when the upper particle is present, the momentary step height G1 may be measured to be large.

In the above case, it is necessary that the actual perforating height Hh does not consider the displacement measurement that includes the upper particle Pu. Accordingly, the displacement measure module 220 may not consider the measurement on the displacement Ds when the momentary step height G1 is equal to or greater than a previously set first reference value. In this case, the displacement of the corresponding perforating point Hp may be determined based on the displacement Ds of another adjacent perforating point Hp.

Specifically, the displacement of the perforating point Hp where the upper particle Pu is present may be determined by matching with the displacement Ds of the adjacent perforating point Hp, or averaging the displacements Ds of immediately preceding and following adjacent perforating points Hp. As a result, the perforating height Hh may be prevented from being erroneously increased due to the presence of the upper particle Pu. As a result, the non-separation phenomenon of the wafer W may be prevented.

Referring to FIGS. 1 and 6, a lower particle Pb may be present under the wafer W. The lower particle Pb may be present on the chuck stage 100 and on the lower portion of the adhesive film 120. That is, the lower particle Pb may change position of the third direction Z of the wafer W on the wafer W and the lower portion of the adhesive film 120.

When the lower particle Pb is present, the displacement Ds of the displacement measure module 220 may be reduced by a height of the lower particle Pb. The displacement Ds in this situation should be considered because the surface of the wafer W is actually heightened. Accordingly, the displacement measure module 220 may consider the displacement measured with the presence of the lower particle Pb, which is different from the example described above in which the displacement measured with the presence of the upper particle Pu is ignored.

The lower particle Pb may be detected according to window WD measurement. The window WD measurement may indicate the displacement Ds measurement of a plurality of adjacent perforating points Hp. The window WD measurement may consider five or more adjacent perforating points Hp together, although not limited thereto.

Within a window WD region, there may be perforating points respectively having a maximum value and a minimum value of the displacement Ds. That is, the perforating point Hp having a maximum value of the displacement Ds may be the perforating point Hp having a highest scan height Hs, and the perforating point Hp having a minimum value of the displacement Ds may be the perforating point Hp having a lowest scan height Hs.

The displacement measure module 220 may determine whether or not the lower particle Pb is present, when difference between a maximum value and a minimum value of the displacement Ds within the window WD region is greater than a previously set second reference value. However, differently from the upper particle Pu, the displacement Ds with respect to the lower particle Pb may change in stages. That is, based on the perforating point Hp having a minimum value of the displacement Ds, the displacement Ds may be gradually decreased as the perforating point Hp is nearer. That is, whether the lower particle Pb is present or not may be determined by confirming a tendency in which the scan height Hs increases gradually at a plurality of perforating points Hp.

That is, the displacement measure module 220 may measure a window step height G2 defined by difference between a maximum value and a minimum value of the displacement Ds within the window WD region. Whether or not the window step height is greater than the previously set second reference value may be determined. When the window step height is determined to be greater, the presence of the lower particle Pb may be determined by confirming (G3) if the displacement Ds is lowered gradually as being nearer to the perforating point Hp having a minimum value of the displacement Ds within the window WD region. This is performed for the purpose of distinguishing the lower particle Pb and the upper particle Pu when detecting the presence of the upper particle Pu with the first reference value. Accordingly, when the momentary step height G1 is greater than the first reference value but determined to be the lower particle Pb, determination as to the presence of the upper particle Pu may be ignored.

That is, when the displacement measured with the first reference value should be ignored, determination may be considered again with the second reference value. As a result, the wafer non-separation phenomenon may be prevented.

The second reference value may be greater than the first reference value to detect the upper particle Pu described above. When the second reference value is smaller than the first reference value, the previous displacement may be considered as is, and there is no need for modification. Only when the second reference value is greater than the first reference value, the situation where the lower particle Pb is mis-recognized as the upper particle Pu can be prevented.

The wafer perforating device according to some exemplary embodiments may prevent an error in the perforating height by detecting the upper particle Pu and ignoring the erroneously measured displacement. Further, the wafer perforating device may avoid the erroneous detection of the lower particle as the upper particle Pu. As a result, the preciseness of the wafer perforating height may be greatly enhanced. Further, the non-separation phenomenon of the wafer, and the pattern damage phenomenon may be minimized.

Hereinbelow, the wafer perforating device according to some exemplary embodiments will be described with reference to FIG. 7. In the following description, description overlapped with the exemplary embodiments already provided above will not be described or described as brief as possible for the sake of brevity. That is, elements having the same reference numerals may be viewed to be the same in different embodiments.

Figure 7:
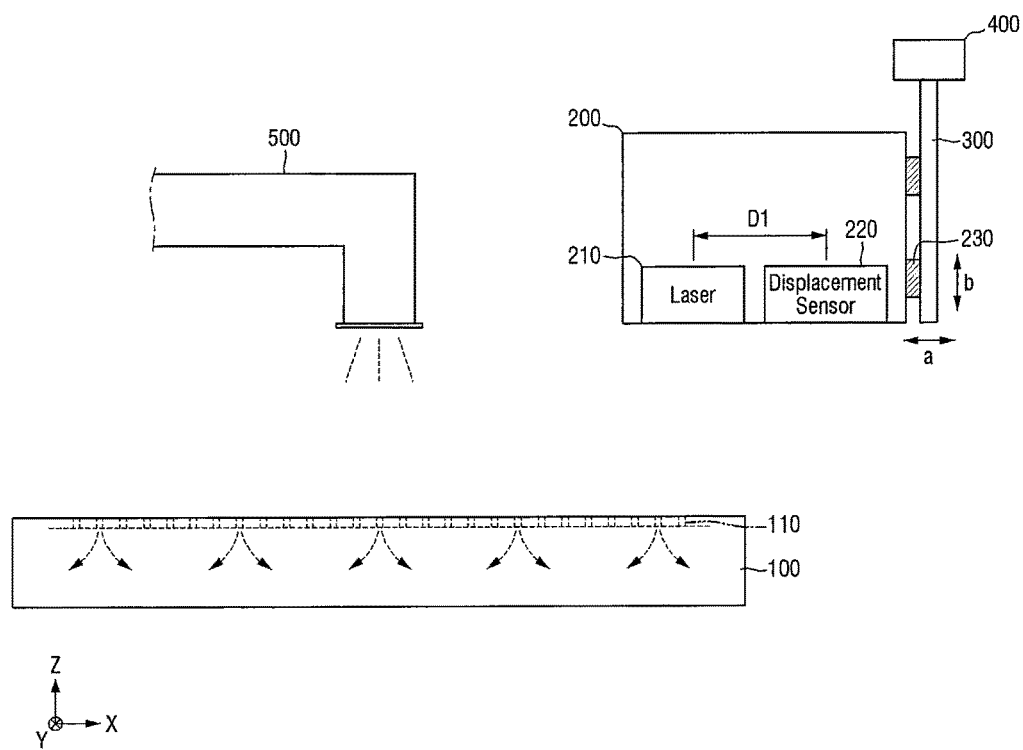
FIG. 7 is a concept view provided to explain a wafer perforating device according to some exemplary embodiments.

FIG. 7 is a concept view provided to explain a wafer perforating device according to some exemplary embodiments.

Referring to FIG. 7, the wafer perforating device according to some exemplary embodiments may further include a cleaning module 500. The cleaning module 500 may clean the upper surface of the chuck stage 100 after perforating the wafer W finishes. The cleaning module 500 may clean the upper surface of the chuck stage 100 by spraying cleaning water to the upper surface of the chuck stage 100.

The cleaning module 500 may be spaced apart from the chuck stage 100 in the third direction Z. The cleaning module 500 may intersect with the chuck stage 100 relatively in the first direction X and the second direction Y. That is, the chuck stage 100 may move in the first direction X and the second direction Y or the cleaning module 500 may move in the first direction X and the second direction Y, such that the cleaning module 500 and the wafer W can be disposed to overlap each other.

The cleaning module 500 may generally clean the chuck stage 100 after a predetermined number of wafers W are cut. Additionally, the cleaning module 500 may clean the upper surface of the chuck stage 100 when a lower particle Pb is detected by the displacement measure module 220. Because an upper particle Pu is formed on the upper surface of the wafer W anyway, when the wafer W is moved, there is none remaining on the chuck stage 100. In contrast, a lower particle Pb may possibly remain even after the wafer W is moved. Accordingly, when a lower particle Pb is detected by the displacement measure module 220, the clean module 500 may clean the upper surface of the chuck stage 100.

When a lower particle Pb is detected, the wafer perforating device according to some exemplary embodiments may additionally perform the cleaning of the chuck stage 100 separately from a normal cleaning schedule. As a result, the lower particle may be prevented from being generated on the wafer W cut later.

Hereinbelow, the wafer perforating device according to some exemplary embodiments will be described with reference to FIGS. 1 and 8. In the following description, description overlapped with the exemplary embodiments already provided above will not be described or described as brief as possible for the sake of brevity. That is, elements having the same reference numerals may be viewed to be same in different embodiments.

Figure 8:
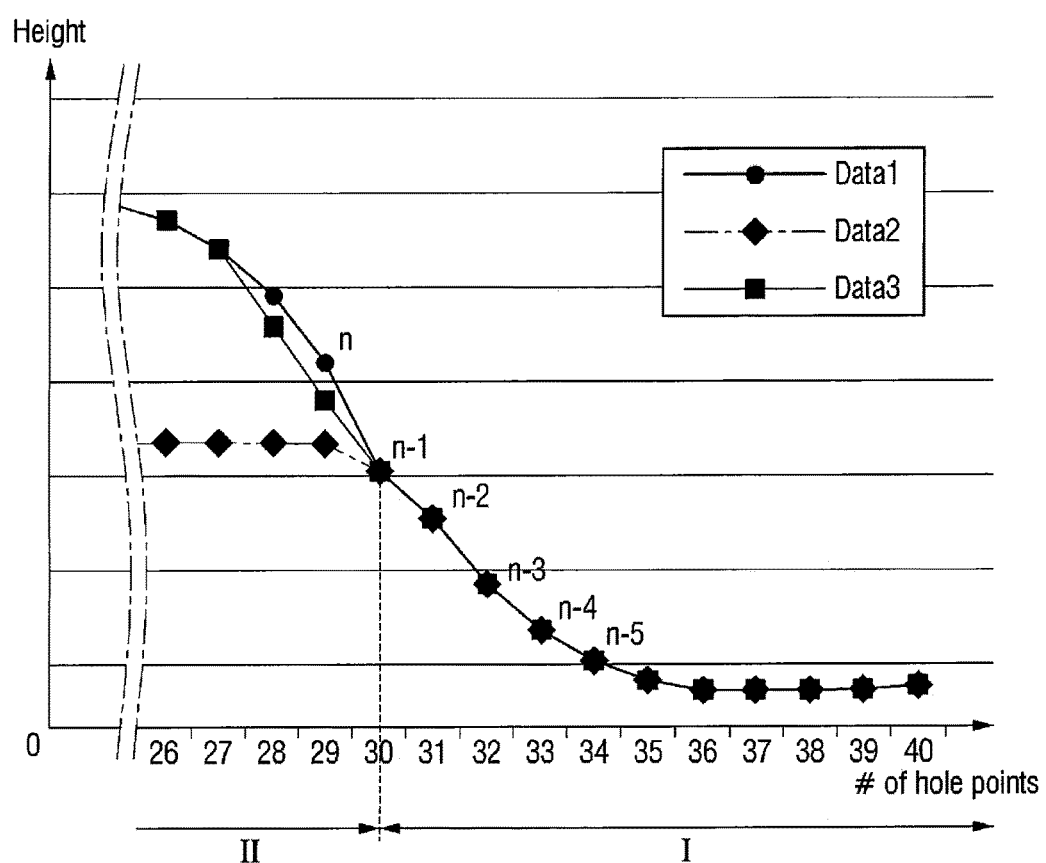
FIG. 8 is an exemplary graph provided to compare measurement data of perforating point with a correction data.

FIG. 8 is an exemplary graph provided to compare measurement data of a perforating point with correction data.

Referring to FIGS. 1 and 8, the fixing arm 300 of the wafer perforating device according to some exemplary embodiments may have a maximum vertical moving distance. The maximum vertical moving distance may be related with the velocity of the Z axis motor 400. That is, the maximum vertical moving distance may be determined by a difference between moving velocity in the horizontal direction a of the Z axis motor 400 and moving velocity in the vertical direction b of the Z axis motor 400. That is, the maximum vertical moving distance may be a limit distance of the Z axis motor 400 moving the fixing arm 300 in the vertical direction b during a time period of moving in the horizontal direction a between the adjacent perforating points Hp.

FIG. 8 is a graph indicating a height according to the perforating point, in which the first data (Data1) represents the perforating height Hh based on the displacement Ds measured by the displacement measure module 220, the second data (Data2) represents the corrected perforating height Hh of the wafer perforating device according to some exemplary embodiments, and the third data (Data3) represents the perforating height Hh which is not corrected.

The graph of FIG. 8 may include a first region I and a second region II. The first region I is where a momentary step height of the perforating height Hh is shorter than the maximum vertical moving distance, and the second region II is where the momentary step height of the perforating height Hh is longer than the maximum vertical moving distance. In the second region II, the third data (Data3) as well as the second data (Data2) may have a same value as the first data (Data1).

However, in the first region I, when the first data (Data1) has a greater step height than the maximum vertical moving distance, perforating may be performed by not considering (i.e., ignoring) the third data (Data3). Accordingly, the perforating height Hh may not change before correction, and perforating may be performed at a lower height than it is actually supposed to be in the first region I.

The wafer perforating device according to some exemplary embodiments may correct the third data (Data3) to the second data (Data2). When the second data (Data2) has a greater step height than the maximum vertical moving distance as in the case of the first data (Data1), the step height may be corrected to be same as the maximum vertical moving distance. As a result, an error in the measured values and the perforating height may be minimized.

Hereinbelow, the wafer perforating device according to some exemplary embodiments will be described with reference to FIGS. 9 and 10. In the following description, description overlapped with the exemplary embodiments already provided above will not be described or described as brief as possible for the sake of brevity. That is, elements having the same reference numeral may be viewed to be same in different embodiments.

Figure 9:
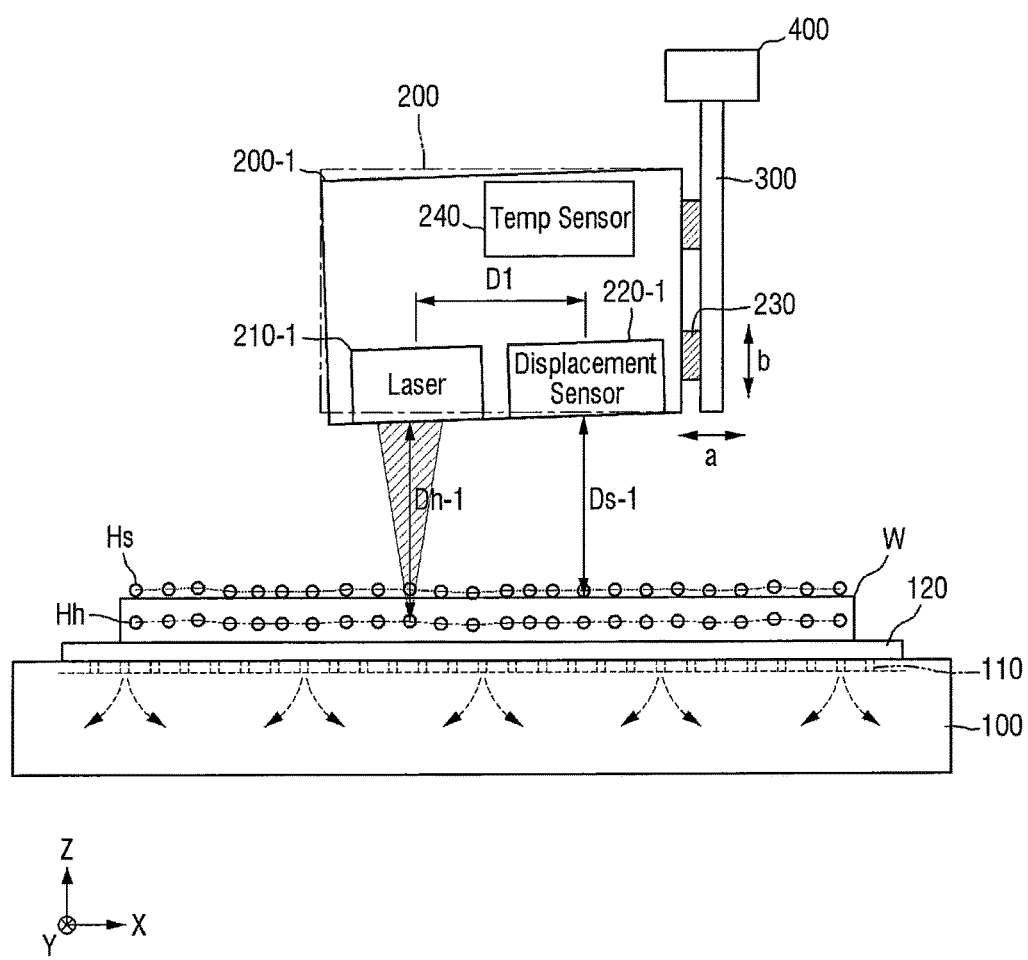
FIG. 9 is a concept view provided to explain a wafer perforating device according to some exemplary embodiments.
Figure 10:
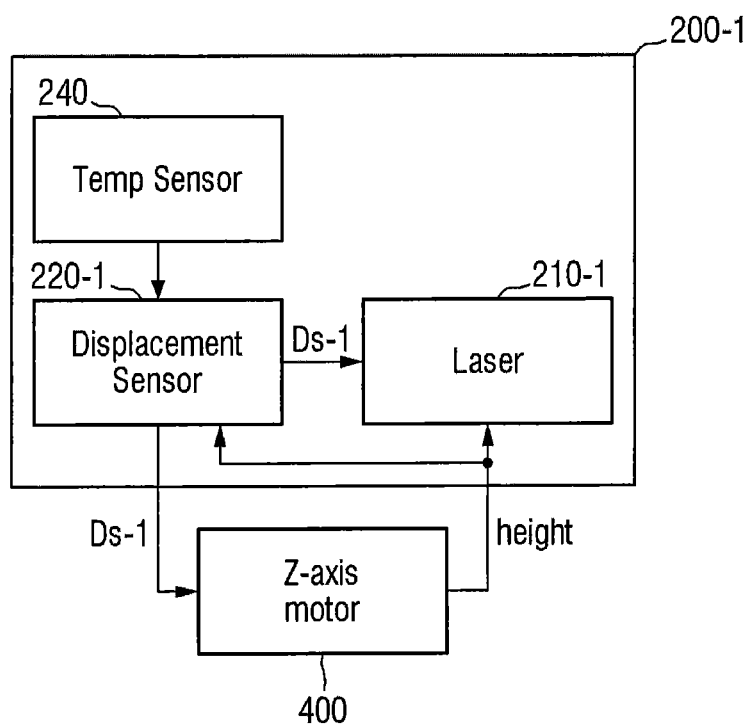
FIG. 10 is a block view provided to explain the wafer perforating device of FIG. 9.

FIG. 9 is a concept view provided to explain the wafer perforating device according to some exemplary embodiments, and FIG. 10 is a block view provided to explain the wafer perforating device of FIG. 9.

Referring to FIGS. 9 and 10, the wafer perforating device according to some exemplary embodiments includes an inclined housing 200-1 and a temperature module 240.

The temperature module 240 may measure temperature inside the housing 200-1. The temperature module 240 may transmit temperature information inside the housing 200-1 to the displacement measure module 220-1. However, exemplary embodiments are not limited to the example given above. The wafer perforating device according to some exemplary embodiments may transmit the temperature information to the displacement measure module 220-1 externally. Note that the wafer perforating device according to some exemplary embodiments may be provided with temperature information from outside. That is, there may be no separate temperature module within the housing 200-1.

The housing 200-1 may be connected through the fixing arm 300 and the bracket 230. The bracket 230 may sag downward according to temperature. Accordingly, the housing 200 may be inclined due to the bracket 230. At this time, the bracket 230 may sag downward when temperature rises. However, exemplary embodiments are not limited to the example given above. In order to reduce the sagging phenomenon, a material of the bracket 230 may be invar. However, even with an invar material, the sagging phenomenon may be only relieved, but may not be completely removed.

According to the inclination of the housing 200-1, the displacement Ds-1 measured by the displacement measure module 220-1 may need correction. Further, the perforating depth Dh-1 of the laser module 210-1 may also need correction. Specifically, the correction amount of the perforating depth Dh-1 of the laser module 210-1 may be greater than the correction amount of the displacement Ds-1. This may be caused by the fact that the laser module 210-1 may be positioned farther from the bracket 230 than the displacement measure module 220-1.

The displacement measure module 220-1 may receive temperature information from a temperature sensor 230. The displacement measure module 220-1 may previously store the sag data of the housing 200-1. The displacement measure module 220-1 may compensate the displacement Ds-1 by using the sag data of the housing 200-1. The sag data may be data formed by recording the sagging of the housing 200-1 according to temperature under the same environment for a plurality of times. The sag data may be newly updated during a new perforating process. The sag data may include variation of the perforating depth Dh-1 of the laser module 210-1 as well as variation of the displacement Ds-1 of the displacement measure module 220-1.

The displacement Ds-1 corrected with the above temperature information may be transmitted to the laser module 210-1 and the Z axis motor 400. Thereby, the laser module 210-1 may derive the corrected perforating depth Dh-1. Further, the Z axis motor 400 may provide a height of the housing 200-1 before sagging, to the displacement measure module 220-1 and the laser module 210-1.

The wafer perforating device according to an exemplary embodiment may correct the housing 200-1 which sags according to temperature, using the previously stored data. Accordingly, inaccuracy of the perforating depth Dh which changes according to temperature may be corrected.

Hereinbelow, the wafer perforating device according to some exemplary embodiments will be described with reference to FIGS. 1, 11A and 11B. In the following description, description overlapped with the exemplary embodiments already provided above will not be described or described as brief as possible for the sake of brevity. That is, the elements having the same reference numeral may be viewed to be same in different embodiments.

Figure 11A:
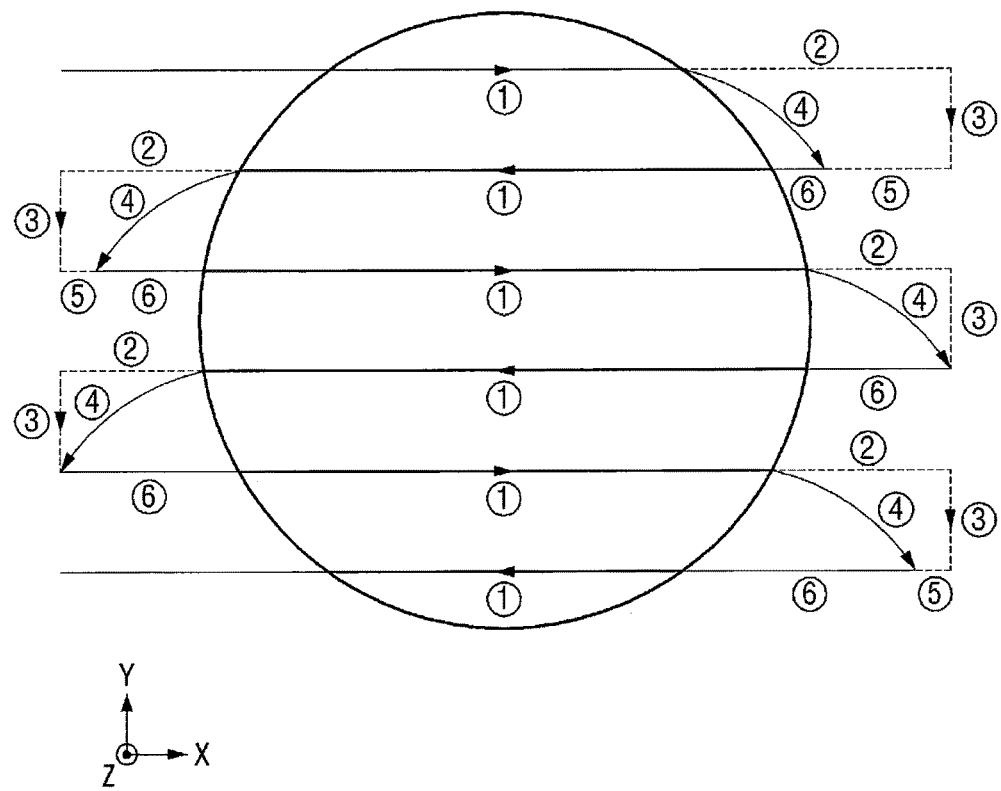
FIG. 11A is a concept view provided to explain a moving path of a wafer perforating device according to some exemplary embodiments.
Figure 11B:
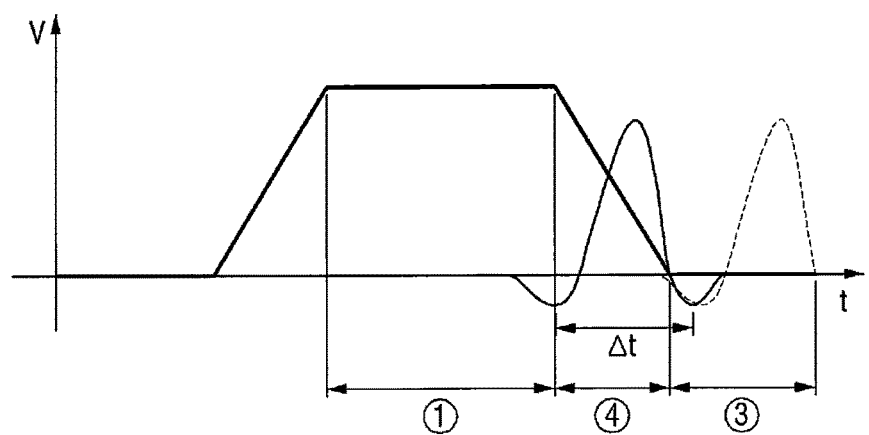
FIG. 11B is a velocity graph provided to explain the moving path of FIG. 11A.

FIG. 11A is a concept view provided to explain a moving path of the wafer perforating device according to some exemplary embodiments, and FIG. 11B is a velocity graph provided to explain the moving path of FIG. 11A.

Referring to FIGS. 1, 11A and 11B, the wafer perforating device according to some exemplary embodiments may include a perforator.

The perforator may include the housing 200, the fixing arm 300, the Z axis motor 400, the displacement measure module 220 and the laser module 210. That is, the perforator may correspond to a portion of the wafer perforating device excluding the chuck stage 100, which moves relatively with the chuck stage 100.

The perforator may move on a solid line path of FIG. 11A. Specifically, the moving path of FIG. 11A may include a constant velocity section ① overlapping with the wafer W and a reduced velocity section ④ where the velocity is reduced to zero.

The perforator on the wafer W may move in the first direction X with the constant velocity. The perforator should move with the constant velocity because stable perforation may be easily performed at constant interval. However, once perforating finishes in the first direction X on the moving path, the perforator should move in the second direction Y and move to a new first direction X path.

Therefore, the section ② to reduce the velocity of the perforator and the section ③ to move in the second direction Y may be needed. Because perforating may not be actually performed in such sections, minimizing these sections may maximize the efficiency of the wafer perforating process.

Accordingly, the perforator may move to an arc-shaped section ④ that combines section ② and section ③. Further, section ⑤ may not be needed because movement proceeds in the arc shape. Accordingly, the perforator may return to section ① after passing section ⑥ slightly.

Such moving section may continue until perforating of the wafer W in the first direction X is finished. Further, when perforating in the first direction X is finished, perforating in the second direction Y which is vertical to the first direction X may be performed with the same method.

Referring to FIG. 11B, it is possible to confirm the relative velocity of the X axis and Y axis of the perforator and the wafer W. In FIG. 11B, the thick solid line indicates a relative velocity on the X axis, and a thin solid line and a dotted line indicate a relative velocity on the Y axis.

Conventionally, in section ③, Y axis movement may be only performed without X axis movement. The wafer perforating device according to some exemplary embodiments may perform Y axis movement by pulling section ③ to section ④. As a result, effects may be obtained, in which a moving time Δt taken in section ③ is reduced.

As a result, according to an embodiment, a time when the wafer perforating process is performed may be significantly shortened by minimizing a time when perforating is not performed. Further, such time saving effects may be especially beneficial in a mass production system, which may lead to the saving of production costs.

Hereinbelow, the wafer perforating device according to some exemplary embodiments will be described with reference to FIGS. 1, and 12 to 14. In the following description, description overlapped with the exemplary embodiments already provided above will not be described or described as brief as possible for the sake of brevity. That is, the elements having the same reference numeral may be viewed to be same in different embodiments.

Figure 12:
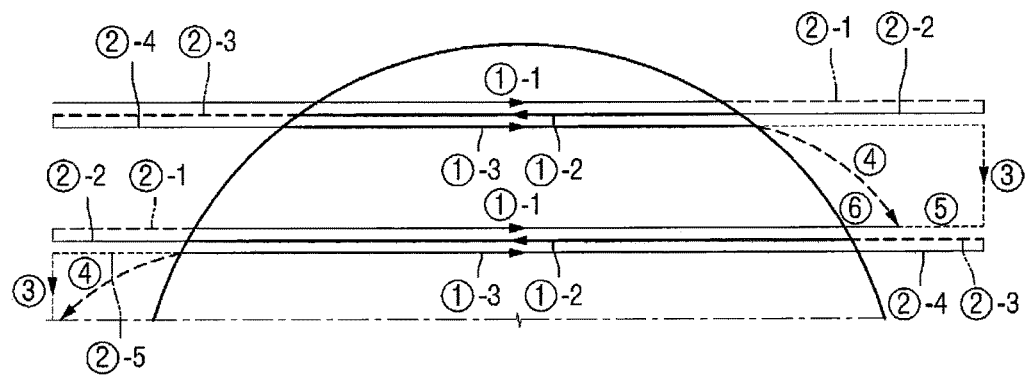
FIG. 12 is a concept view provided to explain a moving path of a wafer perforating device according to some exemplary embodiments.
Figure 13:
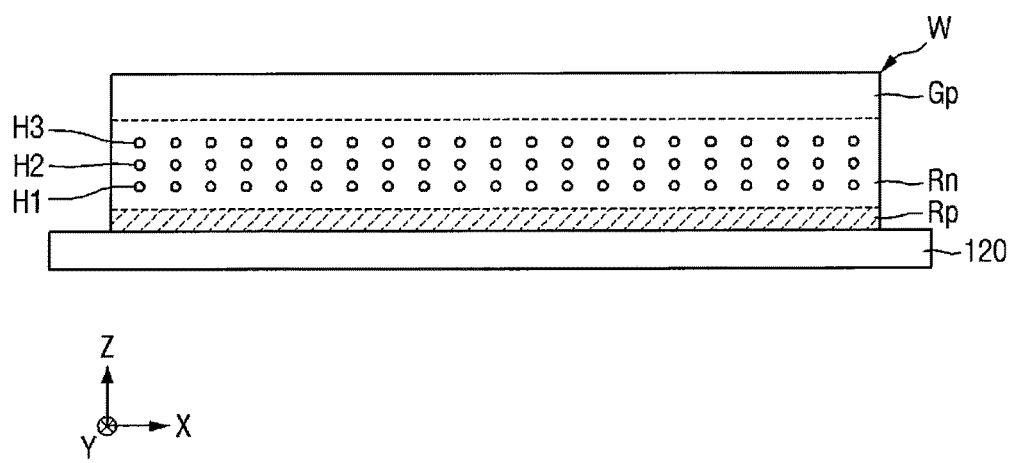
FIG. 13 is an exemplary cross-sectional view provided to explain a perforating depth of the wafer perforating device of FIG. 12.
Figure 14:
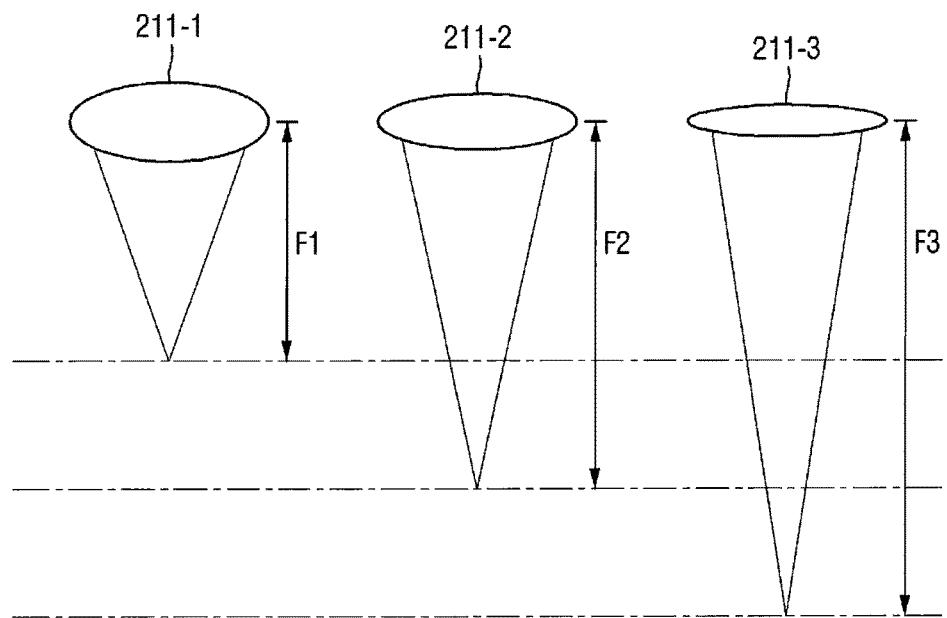
FIG. 14 is a view provided to explain changes of laser focusing through lens movement of the wafer perforating device in FIG. 12.

FIG. 12 is a concept view provided to explain a moving path of the wafer perforating device according to some exemplary embodiments, and FIG. 13 is an exemplary sectional view provided to explain a perforating depth of the wafer perforating device in FIG. 12. FIG. 14 is a view provided to explain changes of laser focusing through lens movement of the wafer perforating device in FIG. 12.

Referring to FIGS. 1, and 12 to 14, the wafer perforating device according to some exemplary embodiments may perform a plurality of perforating for one perforating point Hp. That is, when the wafer W is thick as illustrated in FIG. 13, a plurality of perforating may be performed because separation may be difficult with only one perforating in the third direction Z.

In FIG. 13, perforating may be performed three times for one perforating point Hp, for example, but not limited hereto. That is, the number of perforating overlapping in the third direction Z for one perforating point Hp may have no limitation.

The laser module 210 may include a laser head and a focus lens. In this example, the focus lens may have a specific focus length. That is, the perforating depth Dh may be different according to a type of the focus lens.

The laser module 210 may include three types of the focus lens in order to perform three perforating having different perforating depths Dh from one another, as illustrated in FIG. 14. Specifically, a first focus lens 211-1 may have a first focal distance F1, and a second focus lens 211-2 may have a second focal distance F2. Further, a third focus lens 211-3 may have a third focal distance F3. In this example, the first focal distance F1 may be shorter than the second focal distance F2, and the third focal distance F3 may be longer than the second focal distance F2.

Accordingly, a first hole H1 may be perforated by using the third focus lens 211-3, a second hole H2 may be perforated by using the second focus lens 211-2, and a third hole 113 may be perforated by using the first focus lens 211-1.

Perforating has to be performed in the order of the first hole H1, the second hole H2, and the third hole H3. That is, a deeper hole should be perforated earlier. When there is already a hole at the perforating point Hp, perforating to a deeper depth than the hole may be difficult due to the scattering of the laser by the previously formed hole.

Referring to FIGS. 1 and 12, the moving path of the perforator may be provided such that the perforator may reciprocate the same section in the first direction X for three times, move in the second direction Y, and then reciprocate the same section in the first direction X for three times. Although FIG. 12 illustrates that paths ①-1, ①-2 and ①-3 have fine step heights in the second direction Y, this is provided for convenience of explanation, and the paths may entirely overlap each other.

The moving section of the perforator may include a constant velocity section overlapping with the wafer W and a reduced velocity section where the velocity is reduced to zero.

That is, sections ①-1, ①-2 and ①-3 may be constant velocity sections in which perforating is actually performed. At sections ①-1, ①-2 and ①-3, perforating may be performed by a certain interval, movement may be in the first direction X with the constant velocity.

There may be a reduced velocity section between sections ①-1, ①-2 and ①-3. That is, section ②-1 and section ②-3 may be reduced velocity sections in which the velocity becomes zero in order to go back to the first direction X. Further, as illustrated in FIGS. 11A and 11B, section ④ may be a reduced velocity section, and velocity reduction in the first direction X and movement in the second direction Y may be simultaneously performed.

Because different focus lenses are used at sections ①-1, ①-2 and ①-3, time for the replacement may be needed. The replacement time is the time when perforating may not be performed. Further, the reduced velocity section described above is also the time when perforating may not be performed. Accordingly, in order to minimize the time when perforating may not be performed, the focus lens may be replaced during section ②-1, section ②-3 and section ④.

As a result, according to an embodiment, the time of the wafer perforating process may be significantly shortened by minimizing the time when perforating is not performed. Further, such time saving effects may be especially beneficial in the mass production system, which may lead to the saving of production costs.

Hereinbelow, the wafer perforating device according to some exemplary embodiments will be described with reference to FIGS. 1 and 15. In the following description, description overlapped with the exemplary embodiments already provided above will not be described or described as brief as possible for the sake of brevity. That is, elements having the same reference numeral may be viewed to be same in different embodiments.

Figure 15:
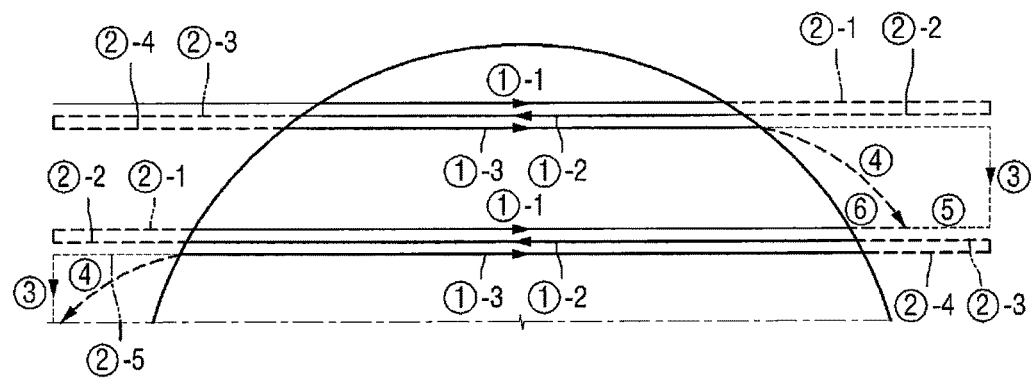
FIG. 15 is a concept view provided to explain a moving path of a wafer perforating device according to some exemplary embodiments.

FIG. 15 is a concept view provided to explain a moving path of a wafer perforating device according to some exemplary embodiments.

Referring to FIGS. 1 and 15, at sections which do not belong to the reduced velocity section among the moving paths of the perforator, but in which perforating is not performed, i.e., at section ②-2 and section ②-4, the focus lens may be replaced.

That is, because perforating is not performed at section ②-2 and section ②-4, replacement of the focus lens may be sequentially performed at section ②-1 and section ②-3. Therefore, even through the entire process time does not take longer than the embodiment of FIGS. 12 to 14, more sufficient replacement time of the focus lens may be ensured.

As a result, the embodiment may minimize the time when perforating is not performed, and the preciseness may be obtained simultaneously because time of the wafer perforating process is greatly reduced.

Hereinbelow, the wafer perforating device according to some exemplary embodiments will be described with reference to FIGS. 1 and 16. In the following description, description overlapped with the exemplary embodiments already provided above will not be described or described as brief as possible for the sake of brevity. That is, the elements having a same reference numeral may be viewed to be the same in different embodiments.

Figure 16:
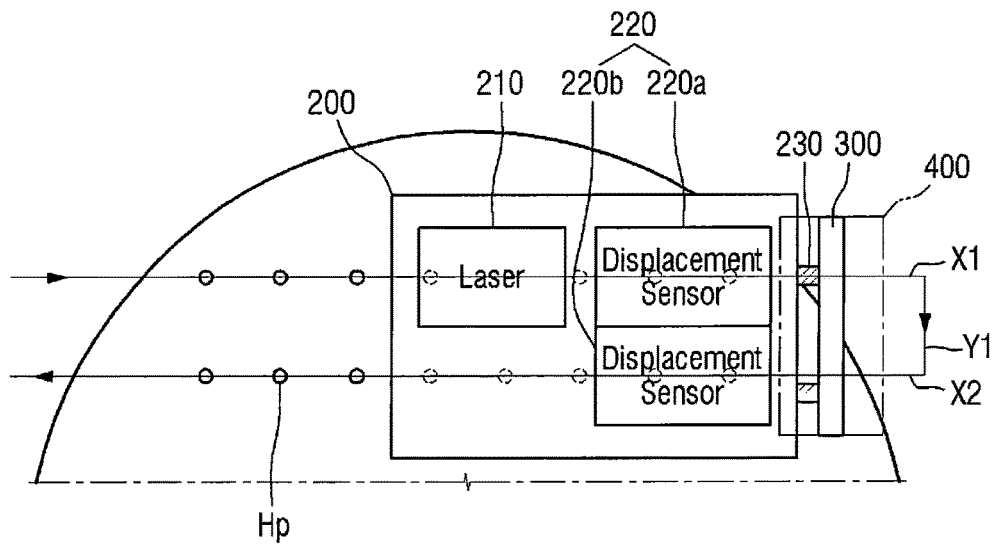
FIG. 16 is an exemplary view provided to explain a manner in which a wafer perforating device is operated according to some exemplary embodiments.

FIG. 16 is an exemplary view provided to explain an operating method of a wafer perforating device according to some exemplary embodiments.

Referring to FIGS. 1 and 16, in the wafer perforating device according to some exemplary embodiments, the displacement measure module 220 may include a first displacement measure module 220a and a second displacement measure module 220b.

The housing 200 may have a moving path including a virtual first line X1 formed with the perforating point Hp in the first direction X, a virtual second line Y1 connected with the first line X1 and formed in the second direction Y, and a virtual third line X2 connected with the second line Y1 and formed in the first direction X. In this example, the housing 200 may overlap with the third line X2 as well as the first line X1. Specifically, when the laser module 210 overlaps with the first line X1, the displacement measure module 220 may overlap with both the first line X1 and the third line X2.

Specifically, the first displacement measure module 220a may be same as the displacement measure module 220 described in FIG. 1. That is, when overlapping with the first line X1, the laser module 210 may perform the perforating accordingly. The second displacement measure module 220b may measure the displacement Ds in an opposite direction from the advancing direction on the third line X2.

That is, because the advancing direction of the first line X1 is a direction in which the first displacement measure module 220a is ahead of the laser module 210, the first displacement measure module 220a may previously measure the displacement Ds, and the laser module 210 may perform the perforating based on the measurement.

However, because the laser module 210 is ahead of the first displacement measure module 220a on the advancing direction of the third line X2, the measurement of the displacement Ds may be difficult before perforating. Accordingly, the second displacement measure module 220b may measure the displacement Ds on the perforating point Hp of the third line X2. That is, the first displacement measure module 220a and the second displacement measure module 220b may simultaneously and respectively measure the displacement of the perforating point Hp on the first line X1 and the third line X2.

As a result, when the laser module 210 advances on the third line X2, the perforating depth Dh may be determined based on the previously measured displacement Ds.

Hereinbelow, the wafer perforating device according to some exemplary embodiments will be described with reference to FIGS. 1 and 17. In the following description, description overlapped with the exemplary embodiments already provided above will not be described or described as brief as possible for the sake of brevity. That is, elements having a same reference numeral may be viewed to be same in different embodiments.

Figure 17:
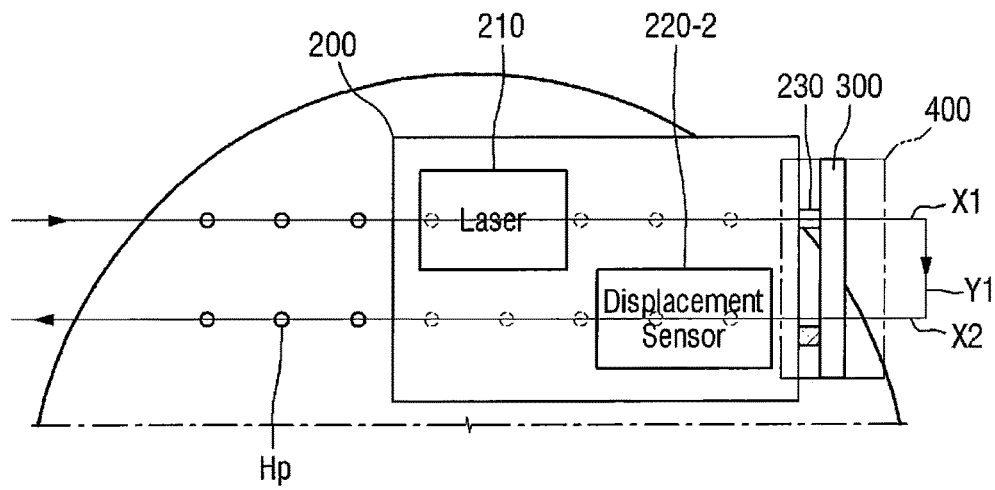
FIG. 17 is an exemplary view provided to explain a manner in which a wafer perforating device is operated according to some exemplary embodiments.

FIG. 17 is an exemplary view provided to explain an operating method of a wafer perforating device according to some exemplary embodiments.

Referring to FIGS. 1 and 17, in the wafer perforating device according to some exemplary embodiments, the displacement measure module 220 may include a third displacement measure module 220-2.

The third displacement measure module may be same as the second displacement measure module 220b in the embodiment of FIG. 16. However, this embodiment does not include the first displacement measure module 220a.

That is, installing the two displacement measure modules on one wafer perforating device may be highly costly. Therefore, according to an embodiment, the third displacement measure module 220-2 may obtain the same effects with a lower cost, by performing the displacement measurement with one displacement measure module, i.e., a third displacement measure module 220-2.

Specifically, the third displacement measure module 220-2 may measure the displacement Ds on a line ahead of the laser module 210. That is, the laser module 210 may not overlap with the perforating point Hp of the wafer W on an initial line, and only the third displacement measure module 220-2 may move to the first line X1 so as to overlap with the perforating point Hp.

Thereafter, the laser module 210 may perform the perforating based on the displacement Ds previously measured by the third displacement measure module 220-2. Simultaneously, the third displacement measure module 220-2 may measure the displacement of the perforating point of the third line X2 in an opposite order from the advancing direction of the third line X2 on the third line X2.

Therefore, the efficiency of the wafer perforating device may be maximized because the same effects is obtained with a lower cost.

Hereinbelow, the wafer perforating device according to some exemplary embodiments will be described with reference to FIGS. 1 and 18. In the following description, description overlapped with the exemplary embodiments already provided above will not be described or described as brief as possible for the sake of brevity. That is, elements having a same reference numeral may be viewed to be same in different embodiments.

Figure 18:
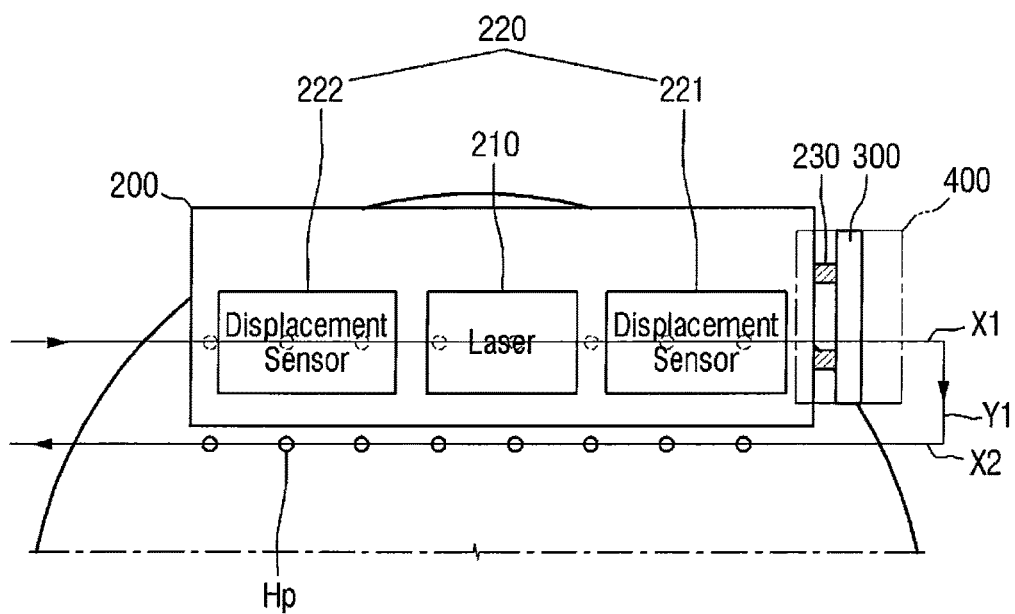
FIG. 18 is an exemplary view provided to explain a manner in which a wafer perforating device is operated according to some exemplary embodiments.

FIG. 18 is an exemplary view provided to explain an operating method of a wafer perforating device according to some exemplary embodiments.

Referring to FIGS. 1 and 18, the displacement measure module 220 may include a fourth displacement measure module 221 and a fifth displacement measure module 222.

The fourth displacement measure module 221 may have a same configuration as the displacement measure module 220 of FIG. 1. That is, the fourth displacement measure module 221 may be a displacement measure module spaced apart from the laser module 210 in the advancing direction of the first line X1. On the contrary, the fifth displacement measure module 222 may be spaced apart from the laser module 210 in an opposite direction from the advancing direction of the first line X1. The fourth displacement measure module 221 may operate during moving on the first line X1, and may not operate during moving on the third line X2. The fifth displacement measure module 222 may not operate while moving on the first line X1, and may operate while moving on the third line X2.

That is, the displacement may be previously measured by using the displacement measure module placed ahead in the advancing direction among the two displacement measure modules, and perforating may be performed. Further, according to the embodiments of FIGS. 16 and 17, a process of measuring the displacement in an inverse order and converting into an original order may be needed. Further, issues such as cost and limited conditions may arise because a memory may be required and calculation amount increases in the above process. However, according to the embodiment of FIG. 18, there is no need to inversely calculate and the need for the memory may be kept minimum.

Accordingly, the wafer perforating device of the present disclosure may lead to maximum efficiency with a simpler configuration.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A wafer perforating device, comprising:
a chuck stage;
a housing spaced apart in a vertical direction from the chuck stage, wherein at least one of the housing and the chuck stage moves in a first horizontal direction, wherein the housing and the chuck stage intersect each other on the first horizontal direction, wherein the housing is attached to a movable arm, and wherein a motor is configured to move the arm and the housing vertically relative to the chuck stage;
a displacement sensor fixed within the housing and configured to measure a displacement of the housing relative to a surface of a wafer mounted on the chuck stage at a perforating point spaced apart periodically along the first horizontal direction, and wherein the displacement sensor is configured to transmit displacement information to the motor; and
a laser module fixed within the housing and configured to irradiate a laser into the wafer at a perforating depth determined according to the displacement at the perforating point, wherein the displacement sensor determines whether an upper particle and a lower particle are present at the perforating point by considering a step height of the displacement, and wherein the displacement sensor ignores the displacement of the perforating point when the upper particle is present and does not transmit the step height to the motor, and wherein the displacement sensor considers the displacement of the perforating point when the lower particle is present and transmits the step height to the motor to cause vertical movement of the arm and the housing.

2. The wafer perforating device of claim 1, wherein the displacement sensor determines the displacement of the perforating point when the upper particle is present based on a displacement of a perforating point adjacent to a perforating point where the upper particle is present.

3. The wafer perforating device of claim 1, wherein, when a momentary step height of the displacement is equal to or greater than a first reference value, the displacement sensor determines whether the upper particle is present at a corresponding perforating point, wherein the momentary step height is a difference from a displacement of an immediately adjacent perforating point.

4. The wafer perforating device of claim 3, wherein the displacement sensor defines a window region comprising N number of adjacent perforating points, and determines that the lower particle is present at the perforating point with a minimum value, when:
a window step height is equal to or greater than a second reference value;
wherein the window step height is a difference between a maximum value and a minimum value of the displacement at a perforating point within the window region; and
wherein the displacement becomes smaller within the window region as being nearer to the perforating point with the minimum value.

5. The wafer perforating device of claim 4, wherein the first reference value is less than the second reference value.

6. The wafer perforating device of claim 1, further comprising a cleaning module configured to clean an upper portion of the chuck stage, wherein,
when the lower particle is present, the cleaning module cleans the upper portion of the chuck stage before a next wafer is mounted on the chuck stage.

7. The wafer perforating device of claim 1, further comprising an adhesive film configured to fix the wafer on the chuck.

8. The wafer perforating device of claim 1, wherein the displacement sensor corrects the displacement according to temperature, and wherein the displacement sensor obtains information with respect to temperature, and corrects the displacement based on sag data of the housing according to the temperature.

9. The wafer perforating device of claim 1, wherein the housing moves at a constant velocity in a first section and at a decreasing velocity in a second section, and
wherein the laser module perforates the wafer when the housing is in the first section, and does not perforate the wafer when the housing is in the second section.

10. The wafer perforating device of claim 1, wherein the displacement sensor and the laser module are spaced apart from each other along the first horizontal direction.

11. A wafer perforating device, comprising:
a chuck stage configured to be mounted with a wafer; and
a perforator comprising a displacement sensor movably positionable relative to the chuck stage in three axis directions which are orthogonal to each other, wherein the displacement sensor is configured to measure a displacement from a surface of the wafer, and a laser module configured to perforate the wafer with a laser based on the displacement, wherein the perforator is attached to a movable arm, wherein a motor is configured to move the arm and the perforator relative to the chuck stage, and wherein the displacement sensor is configured to transmit displacement information to the motor,
wherein a moving section of the perforator moves at a constant velocity in a first section and at a decreasing velocity in a second section,
wherein the laser module perforates the wafer when in the first section, and wherein the laser module does not perforate the wafer when in the second section, and
wherein the displacement sensor is configured to detect an upper particle and a lower particle, wherein the displacement sensor does not transmit the displacement information to the motor when the upper particle is detected, and wherein the displacement sensor corrects the displacement when the lower particle is detected by transmitting the displacement information to the motor to cause vertical movement of the arm and the perforator.

12. The wafer perforating device of claim 11, wherein the displacement sensor and the laser module are spaced apart in a first horizontal direction, and
the perforator moves in the first horizontal direction when in the first section, and moves in the first horizontal direction and a second horizontal direction transverse to the first horizontal direction when in the second section.

13. The wafer perforating device of claim 11, wherein the laser module comprises first and second lenses having different focal distances from each other, and
wherein the laser module replaces the first lens with the second lens when in the second section.

14. The wafer perforating device of claim 13, wherein the laser module perforates a first depth of a perforating point through the first lens, and a second depth of the perforating point through the second lens.

15. A wafer perforating device, comprising:
- a chuck stage;
- a housing spaced apart in a vertical direction from the chuck stage and movably positionable in first and second horizontal directions relative to the chuck stage, wherein the housing is attached to a movable arm, and wherein a motor is configured to move the arm and the housing vertically relative to the chuck stage;
- a displacement sensor fixed within the housing and configured to measure a distance to a surface of a wafer secured to the chuck stage at each of a plurality of perforating points that are spaced apart periodically along the first horizontal direction, and wherein the displacement sensor is configured to transmit displacement information to the motor; and
- a laser module fixed within the housing and configured to irradiate a laser into the wafer at a perforating depth determined according to the distance to the surface of the wafer at each of the perforating points, and wherein the displacement sensor is configured to identify a particle on the surface of the wafer and a particle under the wafer on the chuck stage, wherein the displacement sensor ignores the distance to the surface of the wafer at a location of the particle on the surface of the wafer and does not transmit the distance to the surface of the wafer at the location of the particle on the surface of the wafer to the motor, and wherein the displacement sensor corrects the distance to the surface of the wafer at a location of the particle under the wafer on the chuck stage by transmitting the distance to the surface of the wafer at the location of the particle under the wafer to the motor.

16. The wafer perforating device of claim 15, wherein the housing is configured to move at a constant velocity when in a first section relative to the wafer and at a decreasing velocity when in a second section relative to the wafer, and wherein the laser module perforates the wafer when the housing is in the first section and does not perforate the wafer when the housing is in the second section.

17. The wafer perforating device of claim 15, wherein the displacement sensor and the laser module are spaced apart from each other along the first horizontal direction.

18. The wafer perforating device of claim 15, further comprising a cleaning module configured to clean an upper portion of the chuck stage.

19. The wafer perforating device of claim 15, further comprising an adhesive film configured to fix the wafer on the chuck stage.

20. The wafer perforating device of claim 15, wherein the displacement sensor corrects the distance to the wafer surface according to temperature and/or based on sag data of the housing according to the temperature.

* * * * *